United States Patent
Monahan (10) Patent No.: US 9,490,660 B2
(45) Date of Patent: Nov. 8, 2016

(54) METHODS, SYSTEMS, AND APPARATUS FOR DATACENTER POWER DISTRIBUTION

(71) Applicant: eBay Inc., San Jose, CA (US)

(72) Inventor: James Joseph Monahan, San Francisco, CA (US)

(73) Assignee: eBay Inc., San Jose, CA (US)

(*) Notice: Subject to any disclaimer, the term of this patent is extended or adjusted under 35 U.S.C. 154(b) by 428 days.

(21) Appl. No.: 14/203,103

(22) Filed: Mar. 10, 2014

(65) Prior Publication Data

US 2014/0309802 A1  Oct. 16, 2014

Related U.S. Application Data (60) Provisional application No. 61/810,648, filed on Apr. 10, 2013.

(51) Int. Cl.
| | |
|---|---|
| *H02J 9/06* | (2006.01) |
| *G01R 21/133* | (2006.01) |
| *G06F 1/26* | (2006.01) |
| *B60L 11/18* | (2006.01) |
| *H02J 3/00* | (2006.01) |
| *G06F 1/32* | (2006.01) |
| *H05K 7/14* | (2006.01) |

(52) U.S. Cl.
CPC ............ *H02J 9/06* (2013.01); *B60L 11/1881* (2013.01); *G01R 21/133* (2013.01); *G06F 1/26* (2013.01); *G06F 1/3212* (2013.01); *H02J 3/005* (2013.01); *H05K 7/1498* (2013.01); *H01M 2250/10* (2013.01); *Y02B 60/1292* (2013.01)

(58) Field of Classification Search
CPC .......... H01M 8/04664; H01M 8/249; H01M 8/2495; H01M 2250/10; G06F 1/26; H02J 3/005; H02J 3/38; H02J 9/06; B60L 11/1881; Y10T 307/615
See application file for complete search history.

(56) References Cited

U.S. PATENT DOCUMENTS

| | | | | |
|---|---|---|---|---|
| 6,288,456 B1* | 9/2001 | Cratty | ................... | H02J 3/005 307/64 |
| 6,846,586 B2* | 1/2005 | Aramaki | ............. | B60L 11/1881 429/410 |
| 6,906,933 B2* | 6/2005 | Taimela | ................... | H02J 3/32 363/34 |
| 7,087,327 B2* | 8/2006 | Pearson | ............ | H01M 8/04089 320/101 |
| 7,419,734 B2* | 9/2008 | Pearson | ............ | H01M 8/04679 429/431 |
| 7,656,057 B2* | 2/2010 | Wang | ........................ | H02J 7/34 307/64 |
| 8,410,638 B2* | 4/2013 | Johnson, Jr. | ............. | H02J 3/26 307/105 |
| 2005/0112428 A1* | 5/2005 | Freeman | ............. | B60L 11/1881 429/430 |
| 2008/0176120 A1* | 7/2008 | Dong | ................ | H01M 8/04559 429/432 |
| 2013/0253716 A1* | 9/2013 | Gross | ........................ | G06F 1/26 700/287 |

FOREIGN PATENT DOCUMENTS

CN          202034819 U  * 11/2011

* cited by examiner

*Primary Examiner* — Crystal J Barnes-Bullock
(74) *Attorney, Agent, or Firm* — Schwegman, Lundberg & Woessner, P.A.

(57) ABSTRACT

Methods, systems, and apparatus for electrical power distribution are described. One or more conditions of power provided from one or more fuel cells and one or more fuel cell bypass devices are monitored. At least one of the one or more fuel cell bypass devices is configured to provide power from a first alternate power source to a first electrical device if the monitored power condition of the one or more fuel cells is not satisfied and to allow power to be provided from at least one of the one or more fuel cells if the monitored power condition of the one or more fuel cells is satisfied. A static transfer switch is configured to provide power based on one or more monitored power conditions.

10 Claims, 6 Drawing Sheets

METHODS, SYSTEMS, AND APPARATUS FOR DATACENTER POWER DISTRIBUTION

RELATED MATTERS

This application is a Non-Provisional of and claims the benefit of priority under 35 U.S.C. §119(e) from U.S. Provisional Application Ser. No. 61/810,648, filed on Apr. 10, 2013 which is hereby incorporated by reference herein in its entirety.

TECHNICAL FIELD

The present application relates generally to power distribution, and more specifically, in one example, to power distribution for a datacenter comprising a backup power source.

BACKGROUND

Datacenters are facilities that conventionally provide mission critical resources to many businesses. For example, companies may require highly reliable systems to provide information technology (IT) services and operations on the Internet. The datacenters may comprise computer systems, such as servers, storage systems, telecommunications equipment, and power distribution systems. The power distribution systems may comprise backup or redundant power sources, and may include emergency power generation. The backup or redundant power sources may comprise a battery bank and may be configured as an uninterruptible power supply. The emergency power generation may comprise a diesel or gas turbine generator.

Datacenters are often designed to prevent a single point of failure. The server systems may be redundant and may comprise a system "A" and a system "B." Similarly, the power distribution system may comprise redundant, uninterruptible power supplies. For example, the system "A" may be powered by a first redundant, uninterruptible power supply and the system "B" may be powered by a second redundant, uninterruptible power supply.

BRIEF DESCRIPTION OF THE DRAWINGS

Some embodiments are illustrated by way of example and not limitation in the figures of the accompanying drawings in which.

DETAILED DESCRIPTION

In the following detailed description of example embodiments, reference is made to specific examples by way of drawings and illustrations. These examples are described in sufficient detail to enable those skilled in the art to practice these example embodiments, and serve to illustrate how the invention may be applied to various purposes or embodiments. Other embodiments of the invention exist and are within the scope of the invention, and logical, mechanical, electrical, and other changes may be made without departing from the scope or extent of the present invention. Features or limitations of various embodiments of the invention described herein, however essential to the example embodiments in which they are incorporated, do not limit the invention as a whole, and any reference to the invention, its elements, operation, and application do not limit the invention as a whole but serve only to define these example embodiments. The following detailed description does not, therefore, limit the scope of the invention, which is defined only by the appended claims.

Generally, methods, systems, and apparatus for providing power distribution are described. The power distribution may provide power for redundant computer systems in a datacenter environment and may prevent a single point of failure. The power distribution may comprise multiple power sources and may provide switching between power sources in the event of a component failure or in the event of a degradation of power quality.

Figure 1A:
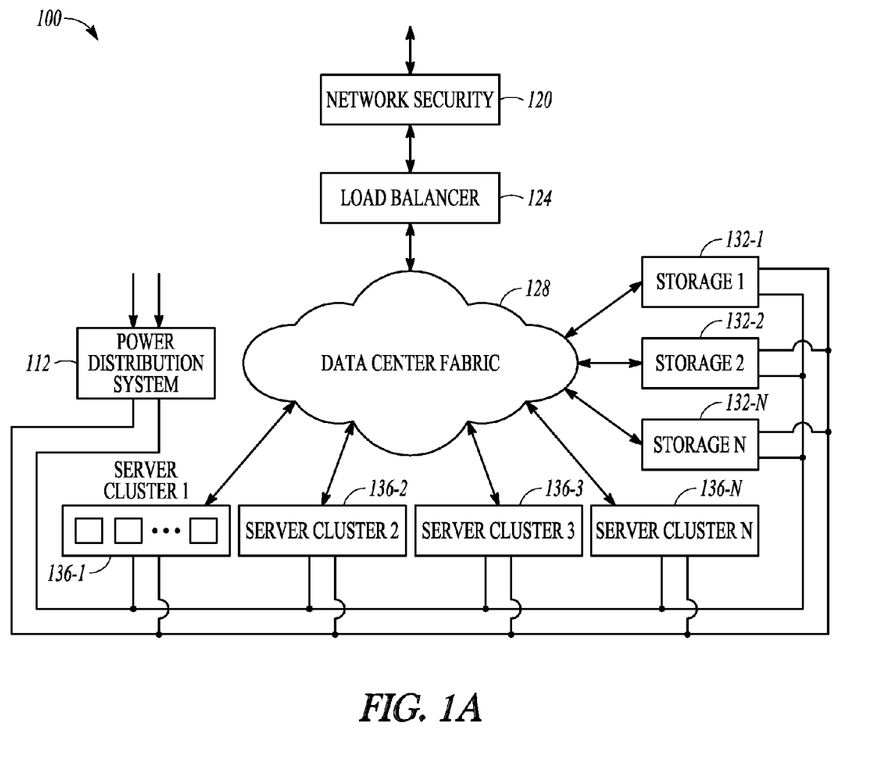
FIG. 1A is a block diagram of an example datacenter for providing computer services, in accordance with an example embodiment.

FIG. 1A is a block diagram of an example datacenter 100 for providing computer services, in accordance with an example embodiment. The datacenter 100 may comprise a network security system 120, a load balancer component 124, a power distribution system 112, storage devices 132-1, 132-2, . . . , 132-N (collectively known as storage devices 132), server clusters 136-1, 136-2, . . . , 136-N (collectively known as server clusters 136), and a data center fabric 128.

The network security system 120 may comprise one or more network security components. For example, the network security system 120 may comprise one or more firewalls, one or more virtual private network (VPN) gateways, one or more network monitoring systems, and the like. The firewalls may, for example, monitor network traffic entering and leaving the datacenter 100 and may control which data packets are allowed to pass through the firewall and which data packets are to be blocked. The virtual private network (VPN) gateways support the creation of virtual private networks by, for example, maintaining VPN tunnels across non-secure networks external to the datacenter 100.

The storage devices 132-1, 132-2, . . . , 132-N may be based on technologies such as storage area networks (SANs), network attached storage (NAS), storage virtualization, and the like. The storage devices 132-1, 132-2, . . . , 132-N may maintain vast amounts of data for processing by the server clusters 136-1, 136-2, . . . , 136-N and for accessing by clients of the datacenter 100.

The server clusters 136-1, 136-2, . . . , 136-N may comprise various servers for providing email services, DNS services, middleware, databases, various applications, and the like, to clients and other users of the datacenter 100. The load balancer component 124 is responsible for distributing workloads across the servers of the server clusters 136. The data center fabric 128 typically comprises a set of switches and routers for transporting data between the server clusters 136, the storage devices 132, and systems external to the datacenter 100.

The power distribution system 112 provides redundant power to the components and systems of the datacenter 100 including the storage devices 132, the server clusters 136, and the data center fabric 128, as described more fully below.

Figure 1B:
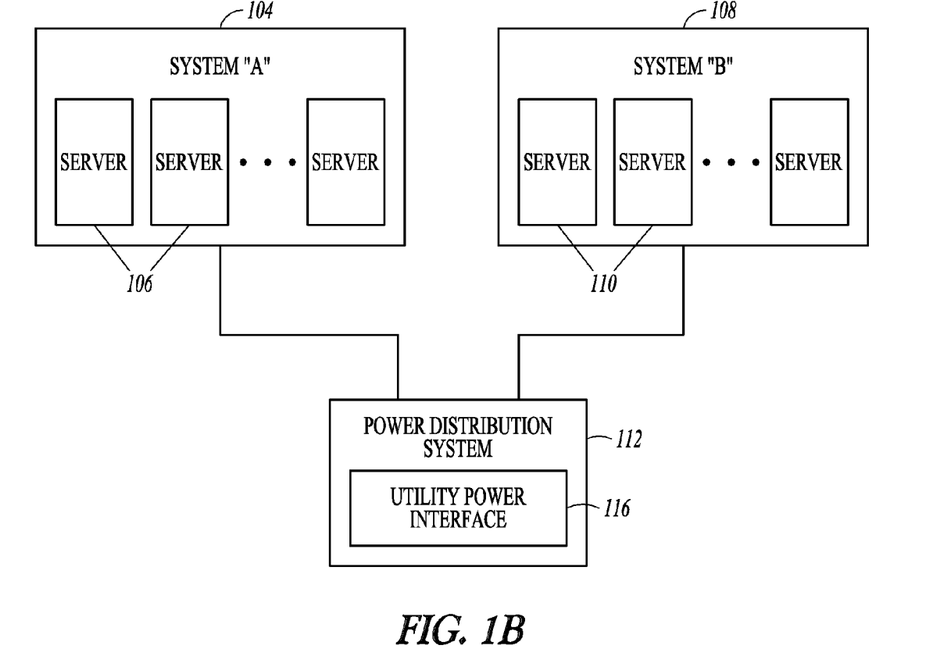
FIG. 1B is a block diagram of an example power distribution system for providing power to servers of a system "A" and servers of a system "B" in a datacenter, in accordance with an example embodiment.

FIG. 1B is a block diagram of an example power distribution system for providing power to servers of a system "A" and servers of a system "B" in a datacenter 100, in accordance with an example embodiment. The system "A" 104 may comprise a first set of servers 106 and the system "B" 108 may comprise a second set of servers 110. The system "A" 104 and the system "B" 108 may be included in the same server cluster 136-1 or in different server clusters 136. The power distribution system 112 may include a utility power interface 116 for interfacing to one or more utility lines in order to receive power from a utility company or other source.

Figure 2A:
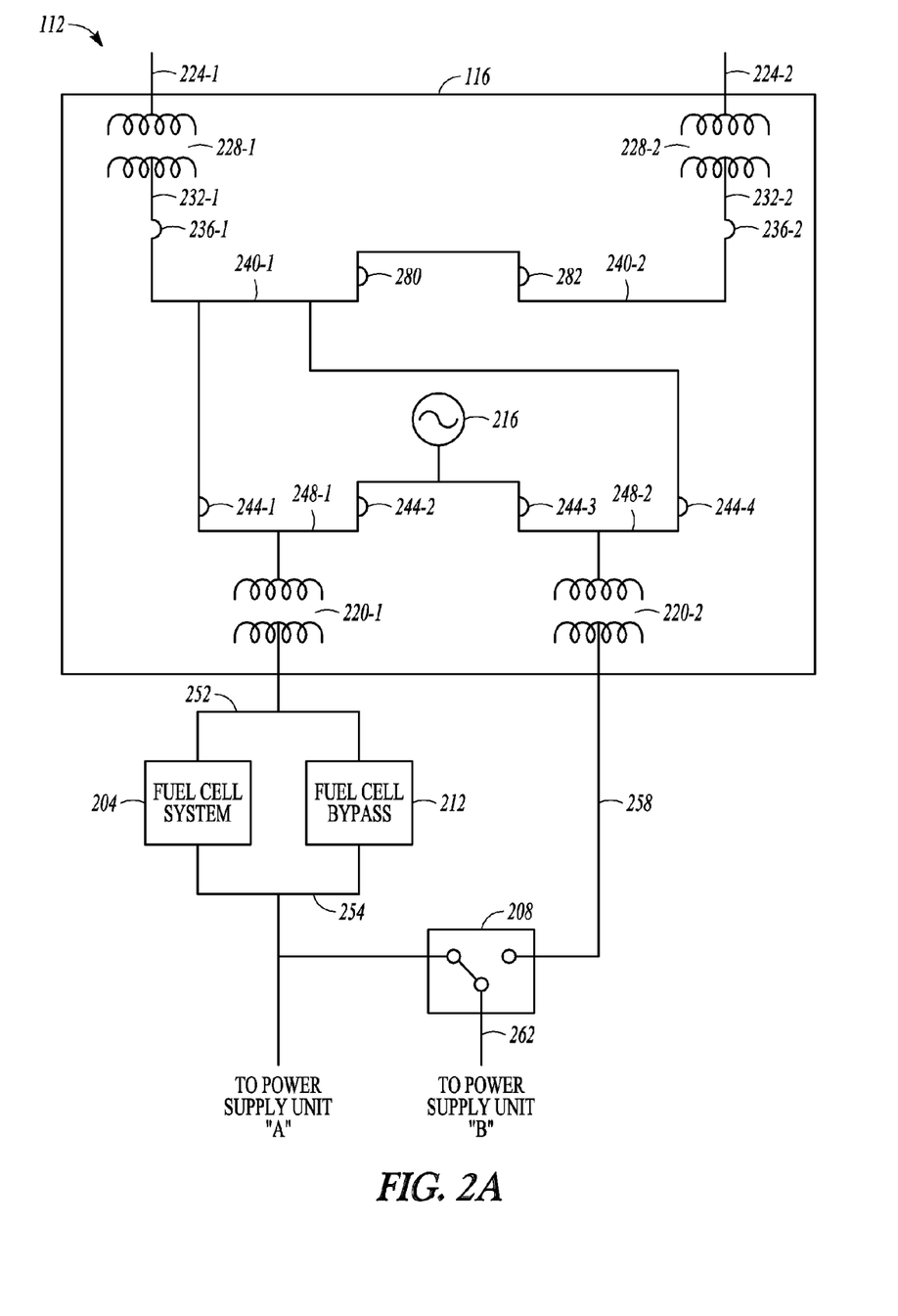
FIG. 2A is a block diagram of an example power distribution system for a datacenter, in accordance with an example embodiment.

FIG. 2A is a block diagram of the example power distribution system 112 for the datacenter 100, in accordance with an example embodiment. The power distribution system 112 may comprise a fuel cell system 204, a fuel cell bypass device 212, a static transfer switch 208, the utility power interface 116, and an optional generator 216.

The fuel cell system 204 may provide 400 volt (V) alternating current (AC) electrical power to a power supply unit A (PSUA) and/or a power supply unit B (PSUB) of each server 106, 110. The fuel cell system 204 may comprise one or more fuel cells. For example, the fuel cell system 204 may comprise one or more solid oxide fuel cells manufactured by Bloom Energy of Sunnyvale, Calif. In one example embodiment, the fuel cell system 204 may be shared by the system "A" 104, the system "B" 108, the server clusters 136, and the storage devices 132.

The utility power interface 116 may provide an interface to a power grid and may obtain power from a utility company. The utility power interface 116 may provide 400 volt (V) alternating current (AC) electrical power. For example, one or more 138,000 VAC utility power lines 224-1 and 224-2 (known as utility power lines 224 hereinafter) may be coupled to the utility power interface 116. In one example embodiment, the utility power interface 116 may be coupled to a single utility power line 224-1. In one example embodiment, the utility power interface 116 may be coupled to each of two independent, utility power lines 224-1 and 224-2. For example, the utility power interface 116 may be coupled to each of two independent 138,000 VAC power lines. The use of redundant power lines 224 may increase the reliability of the utility power source and may increase the reliability of the power distribution system 112.

Utility power line 224-1 may be coupled to a step-down transformer 228-1 to step-down the 138,000 VAC power line to a 13,800 VAC electrical power line 232-1. The 13,800 VAC electrical power line 232-1 may be coupled via a main circuit breaker 236-1 to a main power bus 240-1. The main power line 240-1 may be coupled to main power bus "A" 248-1 via circuit breaker 244-1. The main power bus "A" 248-1 may be coupled to step-down transformer 220-1 to produce 400 VAC electrical power on fuel cell power bus 252. The fuel cell system 204 may provide power to the power supply unit A of a server via a PSUA power bus 254. In the event of a failure of the fuel cell system 204, the fuel cell power bus 252 may be coupled to the PSUA power bus 254 via fuel cell bypass device 212. In the event of a failure of the 13,800 VAC electrical power line 232-1, a switchover to utility power line 224-2 via tie breakers 280 and 282 may be performed, as described more fully below. Alternatively, in the event of a failure of the 13,800 VAC electrical power line 232-1, a switchover to generator 216 via circuit breaker 244-2 may be performed. In one example embodiment, the fuel cell system 204 may provide power to a power grid and/or the utility power lines 224 via the fuel cell power bus 252 and the utility power interface 116.

Utility power line 224-2 may be coupled to a step-down transformer 228-2 to step-down the 138,000 VAC electrical power line to a 13,800 VAC electrical power line 232-2. The 13,800 VAC electrical power line 232-2 may be coupled via a main circuit breaker 236-2 to a main power bus 240-2. As described above, the main power bus 240-2 may be coupled to main power bus 240-1 via tie breakers 280 and 282 in the event of a failure of, for example, the 13,800 VAC electrical power line 232-1.

Each power supply unit B of a server is coupled to and receives power from the static transfer switch 208. The static transfer switch 208 may be, for example, an SBR Series Static Automatic Transfer Switch manufactured by Power Distribution, Inc., of Richmond, Va. The static transfer switch 208 may continually monitor power quality of an incoming power line and may switch from a first power source to a second power source. For example, the static transfer switch 208 may continually monitor power bus 258 and/or the PSUA power bus 254, and may switch from the power bus 258 to the PSUA power bus 254, or may switch from the PSUA power bus 254 to the power bus 258.

The static transfer switch 208 may be capable of transferring AC electrical power between a system that consumes electrical power and one of two or more sources of electrical power. For example, the static transfer switch 208 may transfer 400 VAC power from a power source to the PSUB power line 262. The static transfer switch 208 may be capable of delivering up to 2,000 amps of current and may be capable of switching from a first power source to a second power source within a predefined time period. For example, the static transfer switch 208 may be capable of switching from a first power source to a second power source within three milliseconds (ms).

Returning to FIG. 2A, the PSUB power line 262 may be coupled to a common terminal of the static transfer switch 208. A first terminal of the static transfer switch 208 may be coupled to the generator 216 via the step-down transformer 220-2 and circuit breaker 244-3 or may be coupled to the main power bus 240-1 via step-down transformer 220-2 and circuit breaker 244-4. The step-down transformer 220-2 steps-down the main power bus "A" 248-2 to produce 400 VAC electrical power on power bus 258. A second terminal of the static transfer switch 208 may be coupled to the PSUA power bus 254.

In one example embodiment, a command may be issued to the static transfer switch 208 instructing the static transfer switch 208 to switch from a first power source to a second power source. For example, a command may be issued to the static transfer switch 208 instructing the static transfer switch 208 to switch from the power bus 258 to the PSUA power bus 254.

In one example embodiment, the static transfer switch 208 is capable of detecting a power condition and automatically switching from one power source to another power source based on a detected power condition. For example, the static transfer switch 208 may automatically switch from transferring power provided by the fuel cell system 204 via the PSUA power bus 254 to transferring power provided by the utility power interface 116 via power bus 258.

Figure 2B:
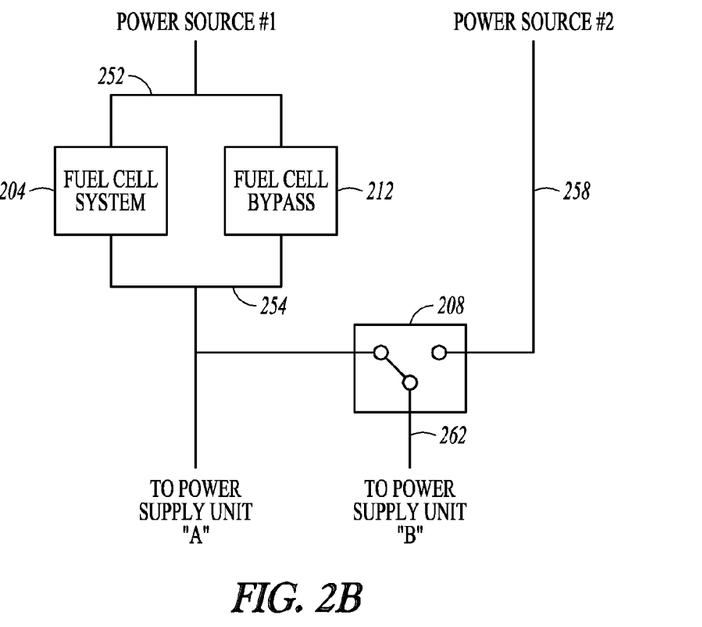
FIG. 2B is a block diagram of an example power distribution system for a general application, in accordance with an example embodiment.

FIG. 2B is a block diagram of an example power distribution system for a general application, in accordance with an example embodiment. The example power distribution system of FIG. 2B may comprise the fuel cell system 204, the fuel cell bypass device 212, and the static transfer switch 208 presented above in conjunction with FIG. 2A.

As described above, the fuel cell system 204 may provide, for example, 400 volt (V) alternating current (AC) electrical power to a power supply unit A (PSUA) and/or a power supply unit B (PSUB) of an electrical device. The fuel cell system 204 may comprise one or more fuel cells, as described more fully above.

In one example embodiment, the fuel cell system 204 may provide power to the power supply unit A of an electrical device via a PSUA power bus 254. In the event of a failure of the fuel cell system 204, the fuel cell power bus 252 may be coupled to the PSUA power bus 254 via the fuel cell bypass device 212. In the latter case, power may be provided to power supply unit A from a power source #1 via the fuel cell bypass device 212. Power source #1 may derive power from one or more alternate power sources. For example, power source #1 may derive power from a utility line, a carbon fuel powered generator, solar panels, battery systems, and the like. In one example embodiment, the fuel cell system 204 may provide power to a power grid and/or the utility power lines 224 via the fuel cell power bus 252 and the utility power interface 116.

Each power supply unit B is coupled to and receives power from the static transfer switch 208. The static transfer switch 208 may continually monitor power quality of an incoming power line and may switch from a first power source to a second power source. For example, the static transfer switch 208 may continually monitor power bus 258 and/or the PSUA power bus 254, and may switch from the power bus 258 to the PSUA power bus 254, or may switch from the PSUA power bus 254 to the power bus 258.

The static transfer switch 208 is capable of transferring AC electrical power between a system that consumes electrical power and one of two or more sources of electrical power. For example, the static transfer switch 208 may transfer 400 VAC power from a power source to the PSUB power line 262. The static transfer switch 208 may be capable of delivering up to 2,000 amps of current and may be capable of switching from a first power source to a second power source within a predefined time period. For example, the static transfer switch 208 may be capable of switching from a first power source to a second power source within three milliseconds (ms).

Returning to FIG. 2B, the PSUB power line 262 may be coupled to a common terminal of the static transfer switch 208. A first terminal of the static transfer switch 208 may be coupled to the PSUA power bus 254. A second terminal of the static transfer switch 208 may be coupled to power source #2. Power source #2 may derive power from one or more alternate power sources. For example, power source #2 may derive power from a utility line, a carbon fuel powered generator, solar panels, battery systems, and the like.

In one example embodiment, a command may be issued to the static transfer switch 208 instructing the static transfer switch 208 to switch from a first power source to a second power source. For example, a command may be issued to the static transfer switch 208 instructing the static transfer switch 208 to switch from the power bus 258 to the PSUA power bus 254, or a command may be issued to the static transfer switch 208 instructing the static transfer switch 208 to switch from the PSUA power bus 254 to the power bus 258.

In one example embodiment, the static transfer switch 208 is capable of detecting a power condition and automatically switching from one power source to another power source based on a detected power condition. For example, the static transfer switch 208 may automatically switch from transferring power provided by the fuel cell system 204 via the PSUA power bus 254 to transferring power provided by power source #2 via power bus 258.

Figure 3:
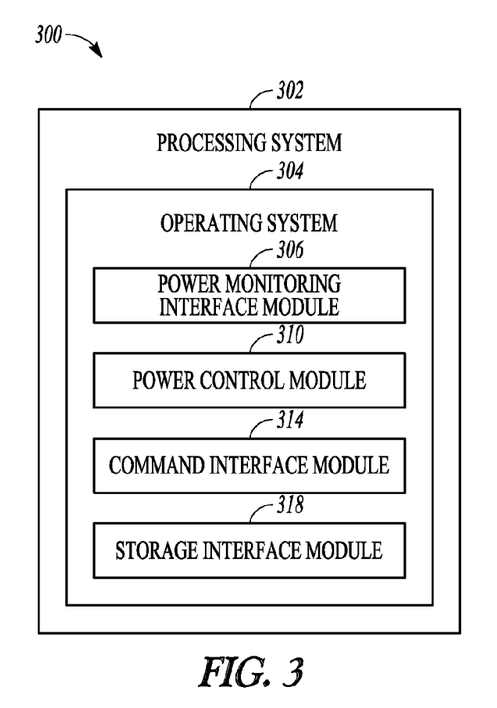
FIG. 3 is a block diagram of an example power management apparatus for managing and controlling a power distribution system, in accordance with an example embodiment.

FIG. 3 is a block diagram of an example power management apparatus 300 for managing and controlling a power distribution system 112, in accordance with an example embodiment. The power management apparatus 300 is shown to include a processing system 302 that may be implemented on a client or other processing device that includes an operating system 304 for executing software instructions.

In accordance with an example embodiment, the power management apparatus 300 may include a power monitoring interface module 306, a power control module 310, and a command interface module 314. In accordance with an example embodiment, the power management apparatus 300 may further include a storage interface module 318.

The power monitoring interface module 306 may monitor, for example, the power from the fuel cell system 204, the power from the fuel cell bypass device 212, the power from the static transfer switch 208, and/or the power from the utility power interface 116. For example, the power monitoring interface module 306 may monitor one or more of a voltage level, a current level, a power quality level, and the like.

The power control module 310 may obtain power status information from the power monitoring interface module 306 and may control the configuration of the static transfer switch 208 and the fuel cell bypass device 212. For example, the power control module 310 may control the configuration of the static transfer switch 208 based on the obtained status information from the power monitoring interface module 306. In one example embodiment, the power control module 310 may command the static transfer switch 208 to switch from power provided by the fuel cell system 204 to the power provided by the utility power interface 116 if, for example, a voltage level of the fuel cell system 204 deviates by greater than five percent from the nominal rating of the fuel cell system 204.

The command interface module 314 may obtain power control parameters from a system administrator or other entity for use by the power control module 310. In one example embodiment, the command interface module 314 may obtain one or more conditions that may be used to determine the configuration of the static transfer switch 208. For example, the command interface module 314 may receive a condition indicating that the static transfer switch 208 should be switched from the PSUA power bus 254 to the power bus 258 if a voltage level of the fuel cell system 204 increases or decreases by greater than five percent from the nominal rating of the fuel cell system 204.

Figure 4:
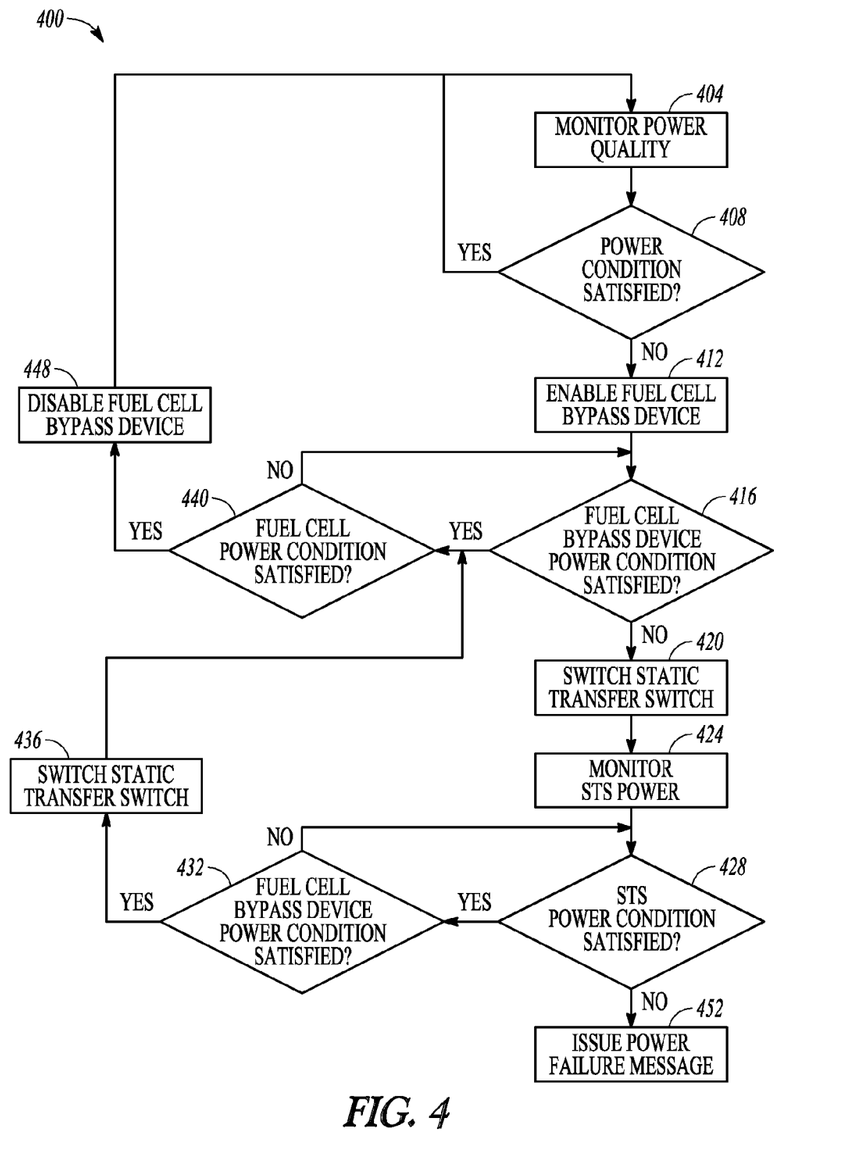
FIG. 4 is an example flowchart for a power management and control method, in accordance with an example embodiment.

FIG. 4 is an example flowchart for a power management and control method 400, in accordance with an example embodiment. In one example embodiment, one or more of the operations of the power management and control method 400 may be performed by the power management apparatus 300.

In one example embodiment, a first power source may be monitored for quality (operation 404). For example, the power quality from the fuel cell system 204 may be monitored. A test may be performed to determine if a condition of the monitored power is satisfied (operation 408). The power condition may be, for example, an amount of allowable deviation of the power level of the output voltage from the fuel cell system 204 in relation to the nominal rating (for example, a deviation of less than five percent may satisfy the power condition). If the power condition is satisfied (e.g., the power level from the fuel cell system 204 is within a five percent deviation from the nominal rating), the method may proceed to operation 404. If the power condition is not satisfied, the fuel cell bypass device 212 may be enabled and power from the utility power interface 116 may be provided to the PSUA power bus 254 (operation 412).

A test may be performed to determine if a power condition of the fuel cell bypass device 212 is satisfied (operation 416). For example, the power condition may be an amount of allowable deviation of the power level of the output voltage from the fuel cell bypass device 212 in relation to the nominal rating (for example, a deviation of less than five percent may satisfy the power condition). If the power condition is not satisfied, the method may proceed with operation 420. If the power condition is satisfied, a test may be performed to determine if a condition of the power from the fuel cell system 204 (e.g., the fuel cell system 204 power condition described above) is satisfied (operation 440). If the condition of the power from the fuel cell system 204 is satisfied (e.g., the power level of the output voltage from the fuel cell system 204 is within a five percent deviation of the nominal rating), the fuel cell bypass device 212 may be disabled (thereby restoring power from the fuel cell system 204; operation 448). The method may then proceed with operation 404. If the condition of the power from the fuel cell system 204 is not satisfied, the method may proceed with operation 416.

During operation 420, the static transfer switch 208 is switched and power from the utility power interface 116 may be provided via power bus 258 to the power supply unit "B". The power from the static transfer switch 208 may be monitored (operation 424). A test may be performed to determine if a condition of the power from the static transfer switch 208 is satisfied (operation 428). The power condition may be, for example, an amount of allowable deviation of the power level of the output voltage from the static transfer switch 208 in relation to the nominal rating (for example, a deviation of less than five percent may satisfy the power condition). If the power condition is not satisfied, a power failure message may be issued (operation 452). For example, if the power from the static transfer switch 208 is not within a five percent deviation from the nominal rating, a power failure message may be issued. If the power condition is satisfied, a test may be performed to determine if a condition of the power from the fuel cell bypass device 212 is satisfied (operation 432). If the power condition is not satisfied, operation 428 may be performed. If the power condition from the fuel cell bypass device 212 is satisfied, the static transfer switch 208 is switched (operation 436) (thereby restoring power from the fuel cell bypass device 212) and the method may proceed with operation 440.

Although certain examples are shown and described here, other variations exist and are within the scope of the invention. It will be appreciated by those of ordinary skill in the art that any arrangement, which is designed or arranged to achieve the same purpose, may be substituted for the specific embodiments shown. This application is intended to cover any adaptations or variations of the example embodiments of the invention described herein. It is intended that this invention be limited only by the claims, and the full scope of equivalents thereof.

Modules, Components and Logic

Certain embodiments are described herein as including logic or a number of components, modules, or mechanisms. Modules may constitute either software modules (e.g., code embodied (1) on a non-transitory machine-readable medium or (2) in a transmission signal) or hardware-implemented modules. A hardware-implemented module is a tangible unit capable of performing certain operations and may be configured or arranged in a certain manner. In example embodiments, one or more computer systems (e.g., a standalone, client or server computer system) or one or more processors may be configured by software (e.g., an application or application portion) as a hardware-implemented module that operates to perform certain operations as described herein.

In various embodiments, a hardware-implemented module may be implemented mechanically or electronically. For example, a hardware-implemented module may comprise dedicated circuitry or logic that is permanently configured (e.g., as a special-purpose processor, such as a field programmable gate array (FPGA) or an application-specific integrated circuit (ASIC)) to perform certain operations. A hardware-implemented module may also comprise programmable logic or circuitry (e.g., as encompassed within a general-purpose processor or other programmable processor) that is temporarily configured by software to perform certain operations. It will be appreciated that the decision to implement a hardware-implemented module mechanically, in dedicated and permanently configured circuitry, or in temporarily configured circuitry (e.g., configured by software) may be driven by cost and time considerations.

Accordingly, the term "hardware-implemented module" should be understood to encompass a tangible entity, be that an entity that is physically constructed, permanently configured (e.g., hardwired) or temporarily or transitorily configured (e.g., programmed) to operate in a certain manner and/or to perform certain operations described herein. Considering embodiments in which hardware-implemented modules are temporarily configured (e.g., programmed), each of the hardware-implemented modules need not be configured or instantiated at any one instance in time. For example, where the hardware-implemented modules comprise a general-purpose processor configured using software, the general-purpose processor may be configured as respective different hardware-implemented modules at different times. Software may accordingly configure a processor, for example, to constitute a particular hardware-implemented module at one instance of time and to constitute a different hardware-implemented module at a different instance of time.

Hardware-implemented modules can provide information to, and receive information from, other hardware-implemented modules. Accordingly, the described hardware-implemented modules may be regarded as being communicatively coupled. Where multiples of such hardware-implemented modules exist contemporaneously, communications may be achieved through signal transmission (e.g., over appropriate circuits and buses) that connects the hardware-implemented modules. In embodiments in which multiple hardware-implemented modules are configured or instantiated at different times, communications between such hardware-implemented modules may be achieved, for example, through the storage and retrieval of information in memory structures to which the multiple hardware-implemented modules have access. For example, one hardware-implemented module may perform an operation and store the output of that operation in a memory device to which it is communicatively coupled. A further hardware-implemented module may then, at a later time, access the memory device to retrieve and process the stored output. Hardware-implemented modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or processors or processor-implemented modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs).)

Electronic Apparatus and System

Example embodiments may be implemented in digital electronic circuitry, or in computer hardware, firmware, software, or in combinations of them. Example embodiments may be implemented using a computer program product, e.g., a computer program tangibly embodied in an information carrier, e.g., in a machine-readable medium for execution by, or to control the operation of data processing apparatus, e.g., a programmable processor, a computer, or multiple computers.

A computer program can be written in any form of programming language, including compiled or interpreted languages, and it can be deployed in any form, including as a stand-alone program or as a module, subroutine, or other unit suitable for use in a computing environment. A computer program can be deployed to be executed on one computer or on multiple computers at one site or distributed across multiple sites and interconnected by a communication network.

In example embodiments, operations may be performed by one or more programmable processors executing a computer program to perform functions by operating on input data and generating output. Method operations can also be performed by, and apparatus of example embodiments may be implemented as, special purpose logic circuitry, e.g., a field programmable gate array (FPGA) or an application-specific integrated circuit (ASIC).

The computing system can include clients and servers. A client and server are generally remote from each other and typically interact through a communication network. The relationship of client and server arises by virtue of computer programs running on the respective computers and having a client-server relationship to each other. In embodiments deploying a programmable computing system, it will be appreciated that both hardware and software architectures require consideration. Specifically, it will be appreciated that the choice of whether to implement certain functionality in permanently configured hardware (e.g., an ASIC), in temporarily configured hardware (e.g., a combination of software and a programmable processor), or a combination of permanently and temporarily configured hardware may be a design choice. Below are set out hardware (e.g., machine) and software architectures that may be deployed, in various example embodiments.

Example Machine Architecture and
Machine-Readable Medium

Figure 5:
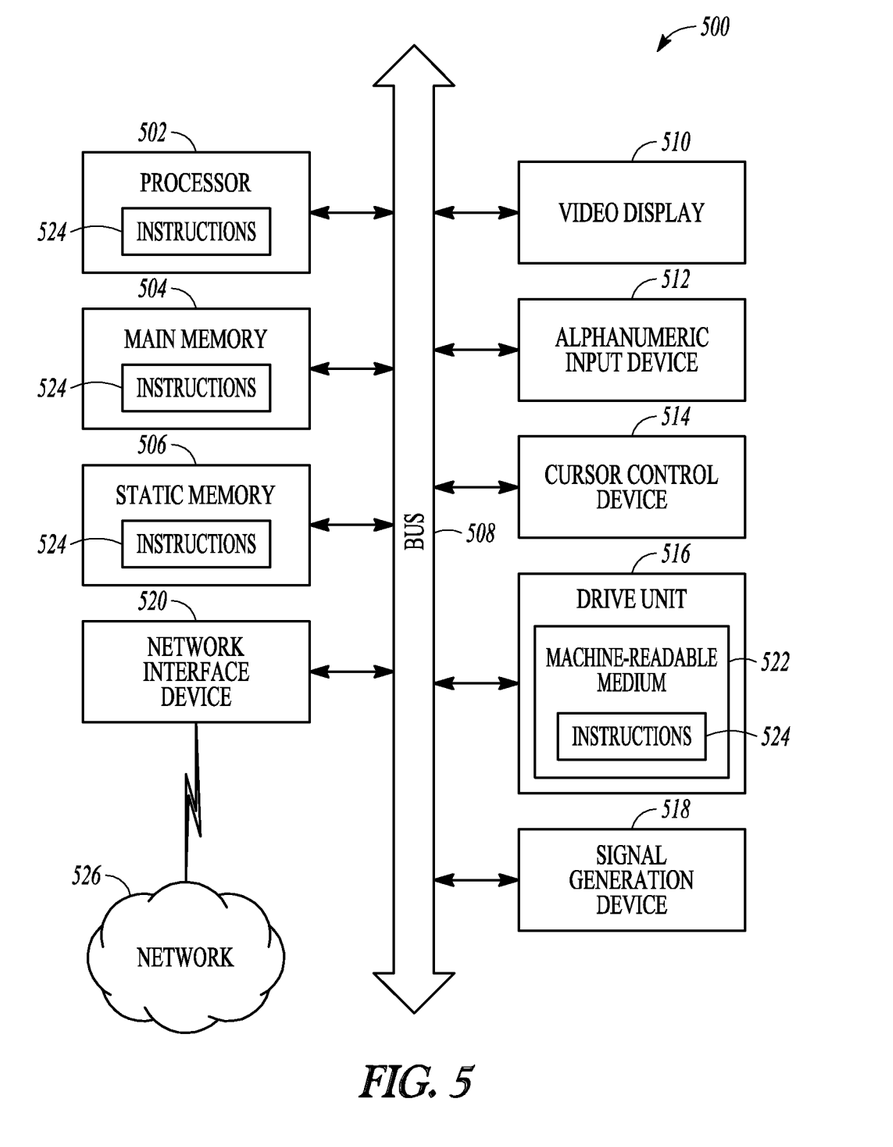
FIG. 5 is a block diagram of a machine within which instructions may be executed for causing the machine to perform any one or more of the methodologies discussed herein.

FIG. 5 is a block diagram of a machine within which instructions may be executed for causing the machine to perform any one or more of the methodologies discussed herein. In one example embodiment, the machine may be the power management apparatus 300. In alternative embodiments, the machine operates as a standalone device or may be connected (e.g., networked) to other machines. In a networked deployment, the machine may operate in the capacity of a server or a client machine in a server-client network environment, or as a peer machine in a peer-to-peer (or distributed) network environment. The machine may be a personal computer (PC), a tablet PC, a set-top box (STB), a personal digital assistant (PDA), a cellular telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 500 includes a processor 502 (e.g., a central processing unit (CPU), a graphics processing unit (GPU) or both), a main memory 504 and a static memory 506, which communicate with each other via a bus 508. The computer system 500 may further include a video display unit 510 (e.g., a liquid crystal display (LCD) or a cathode ray tube (CRT)). The computer system 500 also includes an alphanumeric input device 512 (e.g., a keyboard), a user interface (UI) navigation device 514 (e.g., a mouse), a disk drive unit 516, a signal generation device 518 (e.g., a speaker) and a network interface device 520.

Machine-Readable Medium

The drive unit 516 includes a machine-readable medium 522 on which is stored one or more sets of instructions and data structures (e.g., software) 524 embodying or utilized by any one or more of the methodologies or functions described herein. The instructions 524 may also reside, completely or at least partially, within the main memory 504 and/or within the processor 502 during execution thereof by the computer system 500, the main memory 504 and the processor 502 also constituting machine-readable media. Instructions may also reside within the static memory 506.

While the machine-readable medium 522 is shown in an example embodiment to be a single medium, the term "machine-readable medium" may include a single medium or multiple media (e.g., a centralized or distributed database, and/or associated caches and servers) that store the one or more instructions 524 or data structures. The term "machine-readable medium" shall also be taken to include any tangible medium that is capable of storing, encoding or carrying instructions 524 for execution by the machine and that cause the machine to perform any one or more of the methodologies of the present invention, or that is capable of storing, encoding or carrying data structures utilized by or associated with such instructions. The term "machine-readable medium" shall accordingly be taken to include, but not be limited to, solid-state memories, and optical and magnetic media. Specific examples of machine-readable media include non-volatile memory, including by way of example semiconductor memory devices, e.g., erasable programmable read-only memory (EPROM), electrically erasable programmable read-only memory (EEPROM), and flash memory devices; magnetic disks such as internal hard disks and removable disks; magneto-optical disks; and CD-ROM and DVD-ROM disks.

Transmission Medium

The instructions 524 may further be transmitted or received over a communications network 526 using a transmission medium. The instructions 524 may be transmitted using the network interface device 520 and any one of a number of well-known transfer protocols (e.g., hypertext transfer protocol (HTTP)). Examples of communication networks include a local area network ("LAN"), a wide area network ("WAN"), the Internet, mobile telephone networks, plain old telephone (POTS) networks, and wireless data networks (e.g., WiFi and WiMax networks). The term "transmission medium" shall be taken to include any intangible medium that is capable of storing, encoding or carrying instructions for execution by the machine, and includes digital or analog communications signals or other intangible media to facilitate communication of such software.

Although an embodiment has been described with reference to specific example embodiments, it will be evident that various modifications and changes may be made to these embodiments without departing from the broader spirit and scope of the invention. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. An apparatus for distributing electrical power, the apparatus comprising:
   one or more fuel cells, at least one of the one or more fuel cells coupled to a first electrical device, the at least one of the one or more fuel cells being configured to selectively provide power to the first electrical device; and
   one or more fuel cell bypass devices, at least one of the one or more fuel cell bypass devices coupled to the at least one of the one or more fuel cells, coupled to the first electrical device, and coupled to a first alternate power source, the at least one of the one or more fuel cell bypass devices configured to selectively provide power from the first alternate power source to the first electrical device; and
   one or more static transfer switches, at least one of the one or more static transfer switches coupled to a second alternate power source, coupled to a second electrical device, coupled to one or more of the fuel cells, and coupled to the at least one of the one or more fuel cell bypass devices, the at least one static transfer switch configured to selectively provide power to the second electrical device from the second alternate power source or from one of the one or more fuel cells and the at least one of the one or more fuel cell bypass devices.

2. The apparatus of claim 1, wherein the first alternate power source is dynamically configurable to provide power from a utility power line or a carbon fuel powered generator.

3. The apparatus of claim 1, wherein the second alternate power source is dynamically configurable to provide power from a second utility power line or a carbon fuel powered generator.

4. The apparatus of claim 1, further comprising:
   a processor;
   memory to store instructions that, when executed by the processor, cause the processor to:
      configure the at least one of the one or more fuel cell bypass devices to selectively provide power from the first alternate power source to the first electrical device; and
      configure the at least one of the one or more static transfer switches to selectively provide power to the second electrical device from the second alternate power source or from one of the one or more fuel cells and the at least one of the one or more fuel cell bypass devices.

5. A method to configure an electrical power distribution system, the method comprising:
   monitoring one or more conditions of power provided from one or more fuel cells and one or more fuel cell bypass devices;
   configuring at least one of the one or more fuel cell bypass devices to provide power from a first alternate power source to a first electrical device if the monitored power condition of the one or more fuel cells is not satisfied and to allow power to be provided from at least one of the one or more fuel cells if the monitored power condition of the one or more fuel cells is satisfied; and
   configuring a static transfer switch to provide power from at least one of the one or more fuel cells if the monitored power condition of the one or more fuel cells is satisfied; to provide power from at least one of the one or more fuel cell bypass devices if the monitored power condition of the one or more fuel cells is not satisfied and the monitored power condition of the one or more fuel cell bypass devices is satisfied; and to provide power from a second alternate power source to the second electrical device if the monitored power condition of the one or more fuel cells and the monitored power condition of the one or more fuel cell bypass devices are not satisfied.

6. The method of claim 5, wherein each power condition is a predefined percent of deviation of a power level from a nominal rating and the monitored power condition is satisfied if the corresponding power level is within the corresponding predefined percent of deviation from the nominal rating.

7. The method of claim 5, further comprising monitoring a condition of power provided by the static transfer switch and issuing an error message if the monitored power condition of the one or more fuel cells, the monitored condition of power provided by the one or more fuel cell bypass devices, and the monitored condition of power provided by the static transfer switch are not satisfied.

8. A non-transitory computer-readable medium embodying instructions that, when executed by a processor, perform operations comprising:
   monitoring one or more conditions of power provided from one or more fuel cells and one or more fuel cell bypass devices;
   configuring at least one of the one or more fuel cell bypass devices to provide power from a first alternate power source to a first electrical device if the monitored power condition of the one or more fuel cells is not satisfied and to allow power to be provided from at least one of the one or more fuel cells if the monitored power condition of the one or more fuel cells is satisfied; and
   configuring a static transfer switch to provide power from one of the one or more fuel cells if the monitored power condition of the one or more fuel cells is satisfied; to provide power from at least one of the one or more fuel cell bypass devices if the monitored power condition of the one or more fuel cells is not satisfied and the monitored power condition of the one or more fuel cell bypass devices is satisfied; and to provide power from a second alternate power source to the second electrical device if the monitored power condition of the one or more fuel cells and the monitored power condition of the one or more fuel cell bypass devices are not satisfied.

9. The non-transitory computer-readable medium of claim 8, wherein each power condition is a predefined percent of deviation of a power level from a nominal rating and the monitored power condition is satisfied if the corresponding power level is within the corresponding predefined percent of deviation from the nominal rating.

10. The non-transitory computer-readable medium of claim 8, further comprising instructions that, when executed by a processor, perform operations comprising monitoring a condition of power provided by the static transfer switch and issuing an error message if the monitored power condition of the one or more fuel cells, the monitored condition of power provided by the one or more fuel cell bypass devices, and the monitored condition of power provided by the static transfer switch are not satisfied.

* * * * *